(12) United States Patent
     Takenaka

(10) Patent No.: US 10,640,201 B2
(45) Date of Patent: May 5, 2020

(54) SAFETY DEVICE FOR LANDING IN CROSSWIND

(71) Applicant: Norikazu Takenaka, Hannan (JP)

(72) Inventor: Norikazu Takenaka, Hannan (JP)

(*) Notice: Subject to any disclaimer, the term of this patent is extended or adjusted under 35 U.S.C. 154(b) by 21 days.

(21) Appl. No.: 15/953,498

(22) Filed: Apr. 16, 2018

(65) Prior Publication Data

US 2019/0031326 A1    Jan. 31, 2019

(30) Foreign Application Priority Data

Jul. 25, 2017 (JP) .................................. 2017-143391

(51) Int. Cl.
    *B64C 25/50* (2006.01)
    *G05D 1/02* (2020.01)
    *G03F 9/00* (2006.01)
    *G05D 1/00* (2006.01)

(52) U.S. Cl.
    CPC ............ *B64C 25/505* (2013.01); *B64C 25/50* (2013.01); *G03F 9/7034* (2013.01); *G05D 1/0083* (2013.01); *G05D 1/0204* (2013.01)

(58) Field of Classification Search
    CPC .............................. B64C 25/505; B64C 25/50
    See application file for complete search history.

(56) References Cited

U.S. PATENT DOCUMENTS

| | | | | |
|---|---|---|---|---|
| 6,052,069 A | * | 4/2000 | Silder, Jr. ............... | G01C 23/00 244/17.11 |
| 6,722,610 B1 | * | 4/2004 | Rawdon ............... | B62D 7/1509 244/103 W |
| 9,108,739 B2 | * | 8/2015 | Purpura ................. | B64D 45/00 |
| 9,199,728 B2 | * | 12/2015 | Hahn ....................... | B60T 7/18 |
| 2009/0210105 A1 | * | 8/2009 | Lusby ..................... | B64C 25/34 701/15 |

FOREIGN PATENT DOCUMENTS

| | | |
|---|---|---|
| JP | H08-133189 A | 5/1996 |
| JP | 2004-345435 A | 12/2004 |

OTHER PUBLICATIONS

Japanese decision to grant a patent dated Nov. 21, 2017.
Japanese notice of the reason for refusal dated Sep. 12, 2017.

* cited by examiner

*Primary Examiner* — Brian M O'Hara
(74) *Attorney, Agent, or Firm* — Yokoi & Co., U.S.A.; Toshiyuki Yokoi

(57) ABSTRACT

To provide a safety device that, when a crosswind is present, allows an aircraft to more safely land on a runway in an airport. This safety device 10 for landing in a crosswind is designed for landing of an aircraft 1 on a runway 3 in a crosswind across the runway 3, and provided with a control unit 14 for controlling, when the nose cone 1T of the fuselage 8 of the aircraft 1 is directed windward, the orientation of the wheels of the aircraft 1 such that the wheels are oriented in the direction of travel of the aircraft 1.

2 Claims, 3 Drawing Sheets

SAFETY DEVICE FOR LANDING IN CROSSWIND

CROSS-REFERENCES TO RELATED APPLICATIONS

This patent specification is based on Japanese patent application, No. 2017-filed on Jul. 25, 2017 in the Japan Patent Office, the entire contents of which are incorporated by reference herein.

BACKGROUND OF THE INVENTION

1. Field of the Invention

The present invention relates to a safety device for landing in a crosswind.

2. Description of Related Art

In situations where a crosswind is present, an aircraft may be exposed to risk when landing on a runway in an airport because the crosswind usually causes the aircraft fuselage to drift laterally. To avoid this problem, a landing maneuver is employed in which the aircraft is flown while the fuselage is oriented windward to prevent the aircraft from being pushed by the crosswind. However, when the fuselage is oriented at an angle with respect to the runway upon touchdown, the wheels are subjected to excessive lateral loads and may burst. Additionally, if the aircraft lands in a state in which the fuselage is oriented at an angle, the fuselage may tilt and a main wing may contact with the ground, which leads to an accident. In order to avoid the problem, the fuselage is steered parallel to the runway immediately before touchdown in conventional landing strategies.

For example, Patent Literature 1 discloses a method in the art to which the present invention pertains. Specifically, the method is designed to detect the position of an aircraft and comprises the steps of: transmitting a plurality of transmitted light signals; receiving return light signals from the plurality of transmitted light signals; detecting changes in wavelength for the return light signals; and determining on the basis of the changes in wavelength at least two parameters among a plurality of parameters including the altitude, ground speed and relative wind of the aircraft.

BRIEF SUMMARY OF THE INVENTION

The above-mentioned strategy to steer a fuselage oriented at an angle with respect to a runway to a position parallel to the runway immediately before touchdown largely depends on the flying technique of pilots. In the case of an inexperienced pilot, the landing process may involve some risk. When a sudden crosswind blows after the fuselage is oriented straight, the fuselage should be tilted and then returned to the straight position again. In practice, the landing process has to be redone.

The purpose of the present invention is to provide a safety device for landing in a crosswind that, when a crosswind is present, allows an aircraft to more safely land on a runway in an airport.

The safety device for landing in a crosswind according to the present invention is a safety device for landing an aircraft on a runway in a crosswind blowing across the runway, the safety device for landing in a crosswind being characterized in that: the safety device for landing in a crosswind is provided with a control unit having an automatic mode in which when a nose cone of the aircraft fuselage is directed windward, the orientation of wheels is automatically controlled such that a nose landing gear and main landing gears, which constitute the wheels, are oriented in the direction of travel of the aircraft; and the control unit shifts, after landing on the runway, the mode to a taxi mode in which the nose landing gear including the wheel can be manually steered while the main landing gears including the wheels are continuously oriented in the direction of travel of the aircraft by automatically controlling the orientation of the wheels.

Preferably, the safety device for landing in a crosswind according to the present invention is provided with a tilt detecting unit that, when the nose cone of the aircraft fuselage is directed windward, detects tilt of the fuselage with respect to the direction of travel of the aircraft, and the control unit controls the orientation of the wheels on the basis of the tilt detecting unit such that the wheels are oriented in the direction of travel of the aircraft.

Preferably, in the safety device for landing in a crosswind according to the present invention, the tilt detecting unit determines the tilt as an angle formed between the orientation of the fuselage determined by a gyro sensor provided in the aircraft fuselage and the direction of travel of the aircraft, and the safety device for landing in a crosswind is further provided with a direction detecting unit for determining the direction of travel of the aircraft on the basis of a change over time in positional information obtained from a GPS provided in the aircraft fuselage.

According to the present invention, even when an aircraft fuselage is oriented at an angle with respect to a runway, the wheels of the aircraft are oriented in the direction of travel of the aircraft, thereby removing the need of returning the fuselage of the aircraft to its straight position immediately before touchdown. This leads to a safer landing.

DETAILED DESCRIPTION OF THE INVENTION

Figure 1:
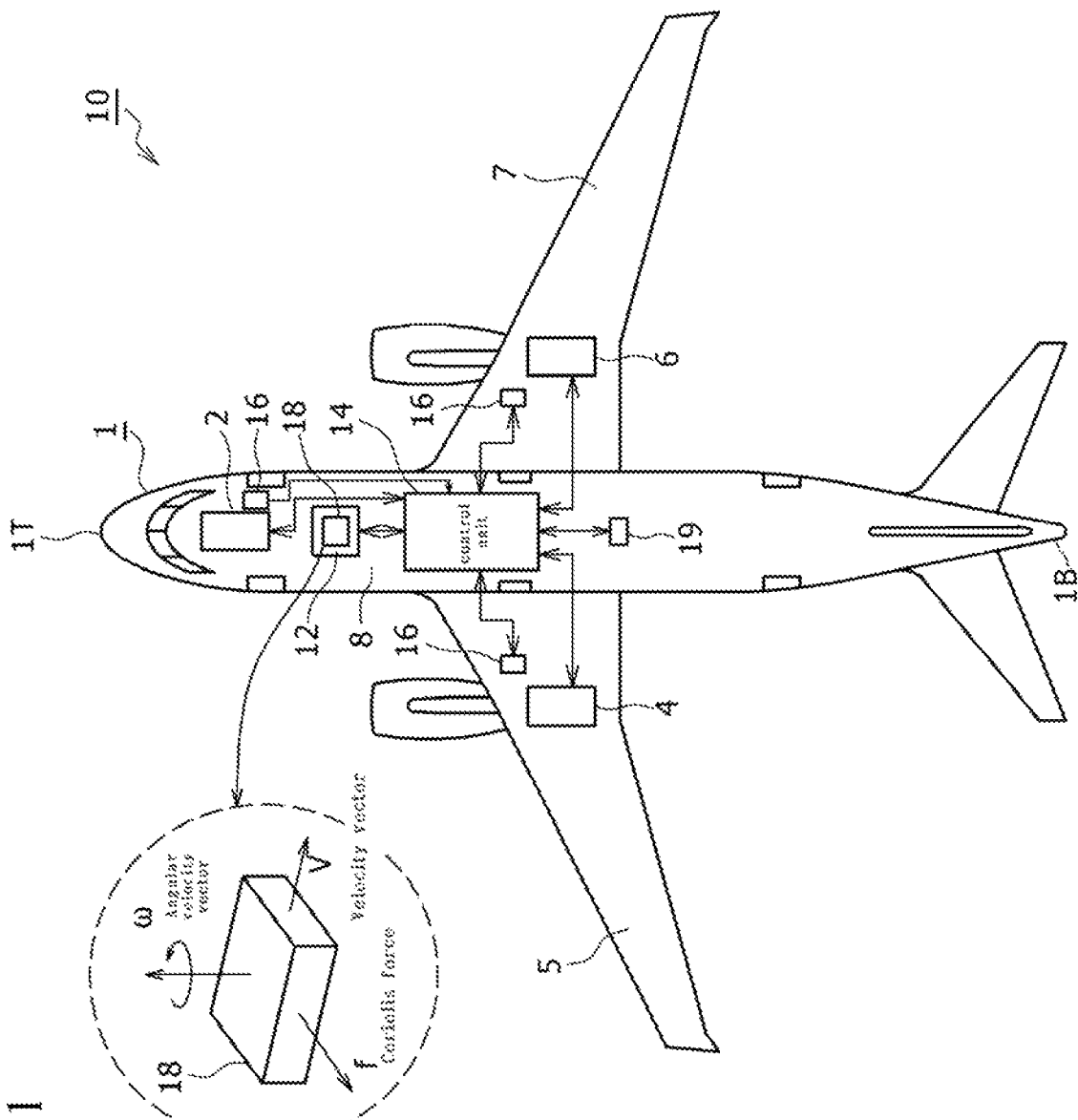
FIG. 1 is a view showing a safety device for landing in a crosswind which controls wheels of an aircraft in an embodiment according to the present invention.

Hereinafter, an embodiment according to the present invention is described in detail with reference to accompanying drawings. In the following, similar components in all the drawings are denoted by identical reference numerals so as to omit duplicated description. The reference numerals will sometimes be used again as required in subsequent description.

Figure 2A:
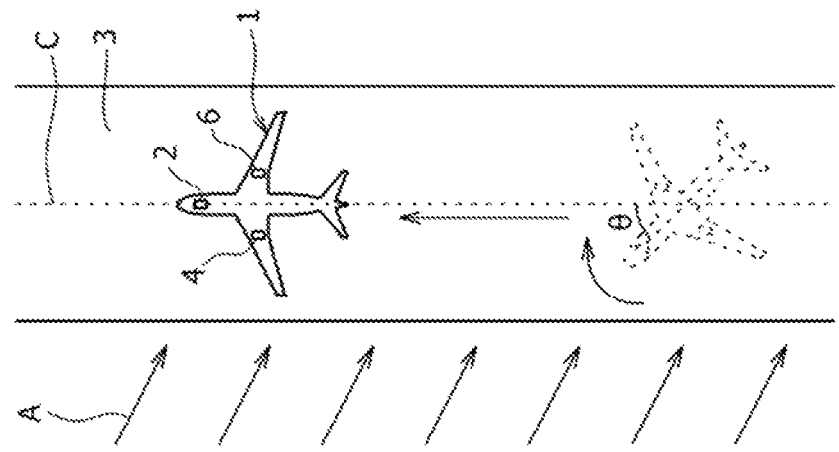
FIGS. 2A and 2B are views showing how to land the aircraft in a crosswind in the embodiment according to the present invention.
Figure 2B:
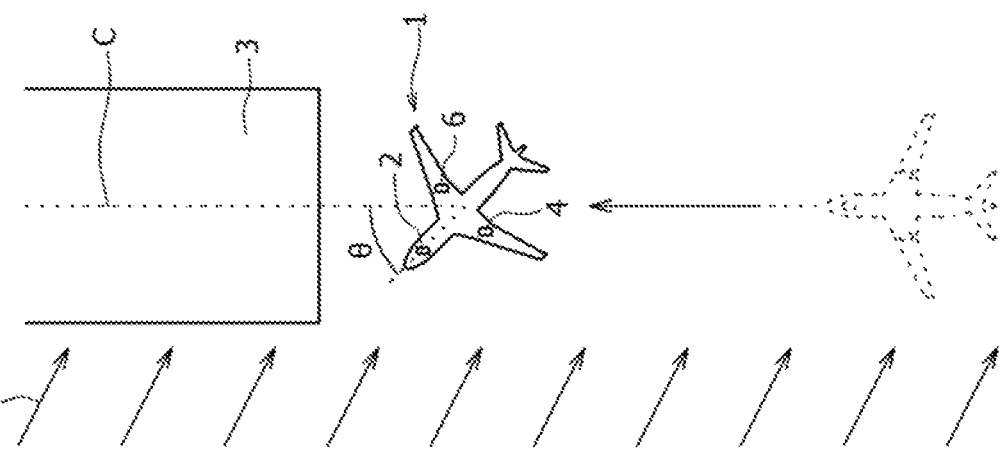
Figure 3:
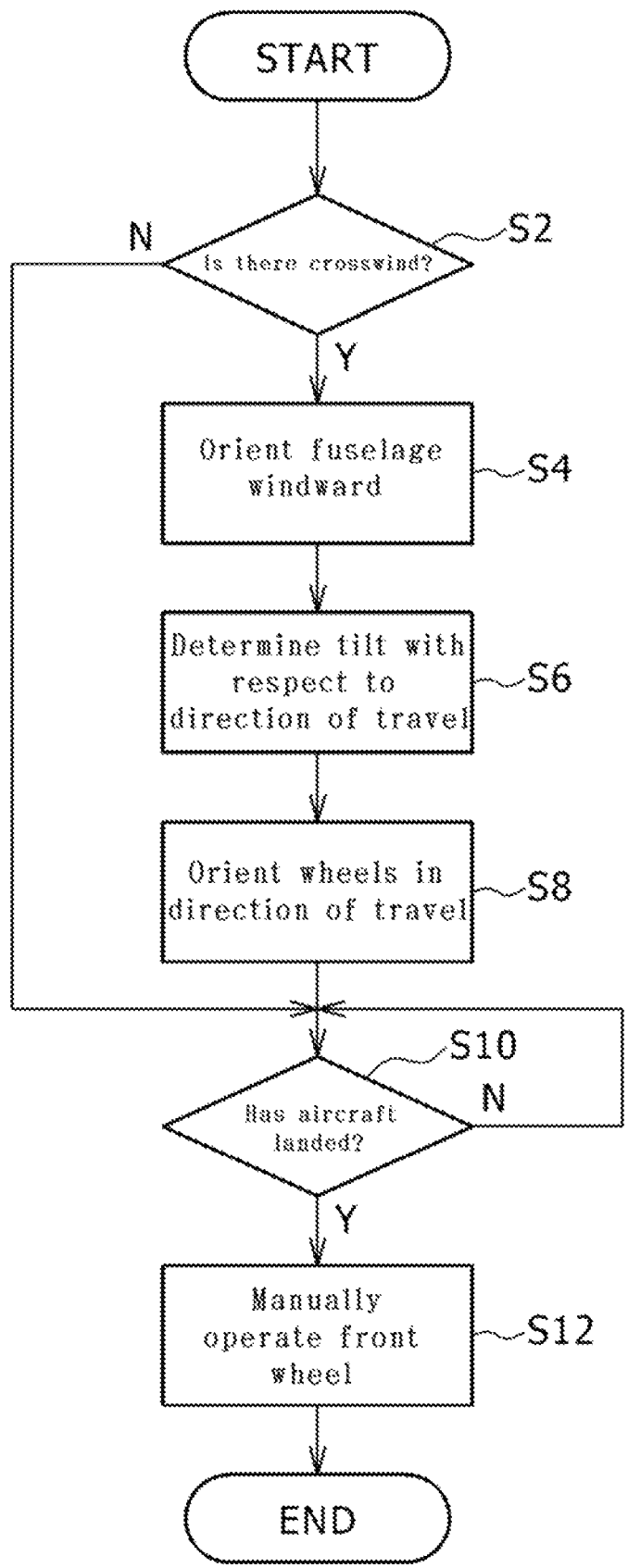
FIG. 3 is a flowchart of a process of controlling the wheels when the aircraft is landing in a crosswind in the embodiment according to the present invention.

FIG. 1 is a view of a safety device 10 for landing in a crosswind that controls wheels of an aircraft 1. FIG. 2A is a view showing how to land the aircraft 1 on a runway 3 in a state in which the fuselage 8 is oriented windward. FIG. 2B is a view showing how to orient the fuselage 8 in the direction of travel on the runway 3 after the aircraft 1 landed on the runway 3. FIG. 3 is a flowchart showing a process of controlling the wheels using the safety device 10 for landing in a crosswind when the aircraft 1 is landing on the runway 3 in a crosswind.

The safety device 10 for landing in a crosswind is a system for controlling the wheels of the aircraft 1 when the aircraft 1 is landing on the runway 3 in a crosswind A across the runway 3. The wheels of the aircraft 1 refer to those of both a nose landing gear 2 and main landing gears 4 and 6.

In normal conditions, a manual mode (taxi mode) is set in which a pilot steers the aircraft 1 such that the orientation of the nose landing gear 2 is changed while the main landing gear 4, 6 are in a fixed state, and for landing in a crosswind, the mode is switched to an automatic mode (landing mode) described below.

The safety device 10 for landing in a crosswind is provided with a tilt detecting unit 12, a control unit 14, a touchdown sensor 16, and a GPS 19.

The tilt detecting unit 12 has a function to detect tilt of the fuselage 8 with respect to the direction of travel of the aircraft 1 when a nose cone 1T of the fuselage 8 of the aircraft 1 is directed in the windward direction of the crosswind A.

The tilt detecting unit 12 determines the tilt of the fuselage 8 as an angle formed between the orientation of the fuselage 8 determined by a gyro sensor 18 and the direction of travel of the aircraft 1. The gyro sensor determines the angle of the fuselage 8 of the aircraft 1 using Coriolis force.

The term "Coriolis force" refers to an apparent force that laterally pushes an object when the object moves in a straight line relative to a rotating reference frame. As shown in FIG. 1, when an object in the gyro sensor 18 moves at a velocity V while the gyro sensor 18 rotates about an upward axis in the right-hand screw direction at an angular velocity ω, a Coriolis force f is generated therein.

The angular velocity is calculated by determining a torsional force of a vibrating body, which constitutes a part of the gyro sensor 18, based on the Coriolis force. The angle of the fuselage 8 of the aircraft 1 can be determined by integrating the angular velocity.

The GPS 19 receives radio waves from a plurality of GPS satellites controlled by United States Department of Defense and determine the distance to each GPS satellite to determine the current location of the aircraft 1 including the GPS 19. It functions as a direction detecting unit that analyzes the trajectory of the aircraft 1 from positional information determined by the GPS 19 to determine the direction of travel of the aircraft 1.

The GPS satellites are, as stated above, those controlled by United States Department of Defense but may be other satellites such as quasi-zenith satellites controlled by Japan Aerospace Exploration Agency (JAXA).

The angle θ formed between the orientation of the fuselage 8 of the aircraft 1 determined as described above and the centerline C of the runway 3 along the direction of travel which corresponds to the direction of travel of the aircraft 1 is determined. When landing on the runway 3, the aircraft 1 is operated such that the direction of travel of the aircraft 1 matches the direction of the centerline C of the runway 3.

The control unit 14 automatically controls the orientation of the nose landing gear 2 and the main landing gear 4, 6 of the aircraft 1 on the basis of the tilt detecting unit 12 such that the nose landing gear 2 and the main landing gears 4, 6 including the wheels are oriented in the direction of travel of the aircraft 1. Specifically, the aircraft 1 is controlled in the automatic mode in which the nose landing gear 2 and the main landing gears 4, 6 are rotated by the angle θ between the fuselage 8 of the aircraft 1 and the runway 3 (the direction of travel of the aircraft 1) so that the orientation thereof matches the direction of the centerline C of the runway 3. It should be noted that the control unit 14 can be constituted from a computer comprising a CPU, an ROM, an RAM and the like. As an alternative to the computer, an automatic control circuit can also be used. The nose landing gear 2 can be operated using a steering mechanism (e.g., steering actuator).

In the case of landing in a crosswind, by operating a crosswind landing button (not shown), the manual mode in which the nose landing gear 2 can be turned manually is switched to the automatic mode under control of the control unit 14.

Additionally, the control unit 14 is switched from the automatic mode to the manual mode when the touchdown sensor 16 described below detects a landing in a crosswind. This enables the pilot of the aircraft 1 to steer and turn the nose landing gear 2.

The touchdown sensor 16 is constituted using a pressure sensor for detecting that the nose landing gear 2 and the main landing gears 4, 6 are pressed by the runway 3 upon landing of the aircraft 1. The touchdown sensor 16 operates in the automatic mode for landing in a crosswind and is capable of outputting detection results to the control unit 14. Hereinafter, the touchdown sensor 16 is described as one using a pressure sensor but may be one using another sensor that detects, for example, the number of revolutions of tires to detect a landing.

The following describes the functions of the safety device 10 for landing in a crosswind configured as described above. It is determined whether or not a crosswind is present across the runway 3 when the aircraft 1 lands on the runway 3 (S2). In order to detect the presence or absence of a crosswind, a wind velocity sensor may be provided in the aircraft 1 itself or a wind velocity sensor provided in the airport may be used. When it is determined in Step S2 that no crosswind is blowing, the process goes to Step S10.

When it is determined in Step S2 that a crosswind is present, the pilot operates the aircraft 1 to orient the fuselage 8 in the windward direction of the crosswind A (S4). As a result, the orientation of the fuselage 8 of the aircraft 1 matches the direction of the crosswind A, as shown in FIG. 2A, thereby preventing the aircraft 1 from being pushed by the crosswind upon landing.

After Step S4, the tilt is determined as the angle θ formed between the orientation of the fuselage 8 determined by the gyro sensor 18 of the tilt detecting unit 12 and the direction of travel of the aircraft 1 (S6). Information relating the angle θ determined as described above is transmitted to the control unit 14.

After Step S6, control is performed on the basis of the angle θ transmitted from the tilt detecting unit 12 such that the orientation of the nose landing gear 2 and the main landing gears 4, 6 including the wheels matches the direction of travel of the aircraft 1 (the centerline C of the runway 3) (S8). This allows for landing in a state in which the fuselage 8 of the aircraft 1 is oriented at an angle.

In Step S10, it is determined whether or not the fuselage 8 of the aircraft 1 has landed on the runway 3. This step is performed by the function of the touchdown sensor 16. When it is determined in Step S10 that the aircraft 1 has not landed yet, the process returns to S10 again.

When it is determined in Step S10 that the aircraft 1 has landed on the runway 3, the mode is switched from the landing mode to the taxi mode. Then, the pilot performs control such that the main landing gears 4, 6 are continuously oriented in the direction of travel while manually operating the nose landing gear 2 (S12). Therefore, the pilot steers the aircraft 1 such that the fuselage 8 of the aircraft 1 matches the centerline C of the runway 8 (the direction of travel), as shown in FIG. 2B. The main landing gear 4, 6 are fixed when the fuselage 8 of the aircraft 1 is oriented parallel to the runway 3 and the main landing gears 4, 6 become parallel to the aircraft axis.

Thus, the safety device 10 for landing in a crosswind enables the aircraft 1 to land on the runway 3 in a crosswind A in a state in which the fuselage 8 of the aircraft 1 is oriented in the windward direction of the crosswind A to prevent the fuselage 8 of the aircraft 1 from being pushed by the crosswind A.

In this process, since the orientation of the nose landing gear 2 and the main landing gears 4, 6 including the wheels matches the direction of the centerline C of the runway 3, it is possible to avoid excessive loads on the wheels. Additionally, there is no need of returning the fuselage 8 to the original orientation immediately before touchdown unlike conventional maneuvers, thereby leading to a safer landing.

The control unit 14 is described hereinbefore as a unit that automatically controls the orientation of the nose landing gear 2 and the main landing gears 4, 6 of the aircraft 1 on the basis of the tilt detecting unit 12 such that the nose landing gear 2 and the main landing gears 4, 6 including the wheels of the aircraft are oriented in the direction of travel of the aircraft 1, but control may be performed without using the tilt detecting unit 12 such that the wheels are oriented in the direction of travel of the aircraft 1. For example, it is possible to perform control such that the wheels (nose landing gear 2, main landing gears 4, 6) are always oriented in the direction of travel of the aircraft 1 determined by the GPS 19.

DESCRIPTION OF SYMBOLS

1 Aircraft
1T Nose cone
3 Nose landing gear
3 Runway
4, 6 Main landing gear
8 Fuselage
10 Safety device for landing in crosswind
12 Tilt detecting unit
14 Control unit
16 Touchdown sensor
18 Gyro sensor
19 GPS

CITATION LIST

Patent Literature

[Patent Literature 1]
JP-T 2010-519129

What is claimed is:

1. A safety device for landing in a crosswind, the safety device being designed for an aircraft landing in a crosswind blowing across a runway and comprising:
    a control unit having an automatic mode in which when a nose cone of an aircraft fuselage is directed windward, an orientation of wheels is automatically controlled such that a nose landing wheel and main landing wheels, which constitute the wheels, are oriented in a direction of travel of the aircraft;
    a tilt detecting unit that, when the nose cone of the aircraft fuselage is directed windward, detects tilt of the aircraft fuselage with respect to the direction of travel of the aircraft; and
    a touchdown sensor which detects the aircraft landing in the crosswind,
    wherein after landing on the runway, the control unit is configured to shift from the automatic mode to a taxi mode in which the nose landing wheel can be manually steered while the main landing wheels are continuously oriented in the direction of travel of the aircraft by automatically controlling the orientation of the wheels,
    the control unit is configured to control the orientation of the wheels on the basis of the tilt detecting unit such that the wheels are oriented in the direction of travel of the aircraft, and
    the control unit is configured to switch from the automatic mode to the taxi mode only when the touchdown sensor detects the aircraft landing in the crosswind.

2. The safety device for landing in a crosswind according to claim 1, further comprising:
    a direction detecting unit for determining the direction of travel of the aircraft on the basis of a change over time in positional information obtained from a GPS provided in the aircraft fuselage, wherein
    the tilt detecting unit is configured to determine the tilt as an angle formed between the orientation of the aircraft fuselage determined by a gyro sensor provided in the aircraft fuselage and the direction of travel of the aircraft.

* * * * *